(12) United States Patent
Byun et al.

(10) Patent No.: US 8,698,628 B2
(45) Date of Patent: Apr. 15, 2014

(54) ELECTRONIC SHELF LABEL SYSTEM AND METHOD FOR DRIVING THE SAME

(75) Inventors: Gi Young Byun, Incheon-si (KR); Chang Soo Lim, Seoul (KR); Jae Chan Lee, Gyeonggi-do (KR); Hyun Hak Kim, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 344 days.

(21) Appl. No.: 12/947,965

(22) Filed: Nov. 17, 2010

(65) Prior Publication Data

US 2012/0013467 A1 Jan. 19, 2012

(30) Foreign Application Priority Data

Jul. 15, 2010 (KR) .......... 10-2010-0068570

(51) Int. Cl.
*G08B 13/14* (2006.01)
(52) U.S. Cl.
USPC ............. 340/572.1; 340/568.1; 340/10.34
(58) Field of Classification Search
USPC .......... 340/572.1–572.9, 568.1, 573.4, 573.1, 340/5.91, 6.1, 8.1, 10.34
See application file for complete search history.

(56) References Cited

U.S. PATENT DOCUMENTS

| | | | |
|---|---|---|---|
| 5,537,126 A * | 7/1996 | Kayser et al. .................. | 345/2.1 |
| 5,619,416 A * | 4/1997 | Kosarew ....................... | 700/225 |
| 5,910,653 A * | 6/1999 | Campo .................... | 250/214 AL |
| 6,715,676 B1 * | 4/2004 | Janning .......................... | 235/383 |
| 2010/0123463 A1 * | 5/2010 | Iwasaki .......................... | 324/433 |
| 2010/0253289 A1 * | 10/2010 | Amir et al. .................... | 320/135 |
| 2011/0121973 A1 * | 5/2011 | Yang .......................... | 340/572.8 |

FOREIGN PATENT DOCUMENTS

| | | |
|---|---|---|
| EP | 1152366 A2 | 11/2001 |
| JP | 07175456 A | 7/1995 |
| JP | 2001266252 A | 9/2001 |
| JP | 2007244795 A | 9/2007 |
| KR | 1020060134274 | 12/2006 |
| KR | 1020100036574 | 4/2010 |

OTHER PUBLICATIONS

Great Britain Office Action GB1101929.6 issued May 26, 2011.
Korean Office Action 1020100068570 Issued Jul. 22, 2011.

* cited by examiner

*Primary Examiner* — Daniel Previl
(74) *Attorney, Agent, or Firm* — Lowe Hauptman & Ham, LLP

(57) ABSTRACT

Disclosed herein is an electronic shelf label system. The electronic shelf label system includes a plurality of electronic tags that are installed on a product display stand and confirms the residual amount of a battery to turn-on a battery warning light when the residual amount is smaller than a reference voltage and transmits replacement request signals to inform the replacement time of the battery; and a wired/wireless communication converter that relays information between the electronic tags and a server and transmits the replacement request signals received from the electronic tags to be relayed thereby to the server. The electronic shelf label system of the present invention can intuitively and easily confirm the timing when the battery of the electronic is replaced, thereby making it possible to improve the efficiency in the working of replacing the battery.

12 Claims, 3 Drawing Sheets

109

ELECTRONIC SHELF LABEL SYSTEM AND METHOD FOR DRIVING THE SAME

CROSS REFERENCE(S) TO RELATED APPLICATION

This application claims the benefit under 35 U.S.C. Section [120, 119, 119(e)] of Korean Patent Application Serial No. 10-2010-0068570, entitled "Electronic Shelf Label System And Method For Driving The same," filed on Jul. 15, 2010, which is hereby incorporated by reference in its entirety into this application.

BACKGROUND OF THE INVENTION

1. Technical Field

The present invention relates to an electronic shelf label system and a method for driving the same, and more particularly, to an electronic shelf label system capable of intuitively and rapidly identifying whether a battery of an electronic tag should be replaced and a method for driving the same.

2. Description of the Related Art

Generally, a paper label representing information and prices of each product has been mainly used at places where a large number of products are displayed and sold in a predetermined space, such as a distribution store, or the like. However, since it is cumbersome to write the updated information on the paper label one by one each time the product information is updated, and it is difficult to manage the paper label, the paper label is being replaced with an electronic tag.

When the updated information of the products is wirelessly transmitted in a wired/wireless communication converter according to a request of a central server, the electronic tag receives and displays the updated information. That is, it can control the electronic tags for all the products through the central server and efficiently manage them. Since these electronic tags include many circuits, such as a communication interface unit, a processor unit, a display panel, or the like, they should be supplied with continuous power. In order to solve the problem, a battery is mounted in the electronic tag.

Meanwhile, the lifespan of a battery is determined by several conditions such as natural discharging, communication frequency, frequency in use of a display, or the like. Therefore, even when batteries having the same capacity are mounted in the electronic tags, a battery discharging rate is different and thus, replacement of batteries may be different. Since the electronic tag communicates with the wired/wireless communication converter depending on a power supply of a battery in the distribution store and continuously provides the product information to a consumer through the display panel, it is important to replace a battery before the lifespan of a battery has almost ended.

However, since the number of electronic tags used in the distribution store may be several thousands to tens of thousands, searching the electronic tags of which batteries should be replaced requires a great deal of efforts and time.

SUMMARY OF THE INVENTION

An object of the present invention is to provide an apparatus capable of intuitively and easily identifying when a battery of an electronic tag is replaced.

According to an exemplary embodiment of the present invention, there is provided an electronic shelf label system, including: a plurality of electronic tags that are installed on a product display stand and confirms the residual amount of a battery to turn-on a battery warning light when the residual amount is smaller than a reference voltage and transmits replacement request signals to inform the replacement time of the battery; and a wired/wireless communication converter that relays information between the electronic tags and a server and transmits the replacement request signals received from the electronic tags to be relayed thereby to the server.

According to another exemplary embodiment of the present invention, there is provided a method for operating an electronic shelf label system in an electronic shelf label system including a plurality of electronic tags having a battery, a battery monitoring unit monitoring the residual amount of the battery and a wired/wireless communication converter relaying information between the electronic tags and a server, the method including: (a) checking the residual amount of the battery at a predetermined checking period; (b) turning-on a first battery warning light and transmitting replacement request signals to the wired/wireless communication converter to request the replacement of the battery, when the battery voltage is smaller than a reference voltage; and (c) transmitting the replacement request signals to the server by the wired/wireless communication converter.

DESCRIPTION OF THE PREFERRED EMBODIMENTS

Hereinafter, exemplary embodiments of the present invention will be described with reference to the accompanying drawings. However, the exemplary embodiments are described by way of examples only and the present invention is not limited thereto.

In the following description, when it is determined that the detailed description of the conventional technology related to the present invention would confuse the gist of the present invention, such a description may be omitted. Terms used in the specification and claims herein are defined by considering the functions thereof in the present invention so that they may be varied according to a user's and an operator's intends or practices. Therefore, the definitions thereof should be construed based on the contents throughout the specification.

As a result, the spirit of the present invention is determined by the claims and the following exemplary embodiments may be provided to efficiently describe the spirit of the present invention to those skilled in the art.

Hereinafter, an electronic shelf label system according to exemplary embodiments of the present invention will be described below with reference to the accompanying drawings.

Figure 1:
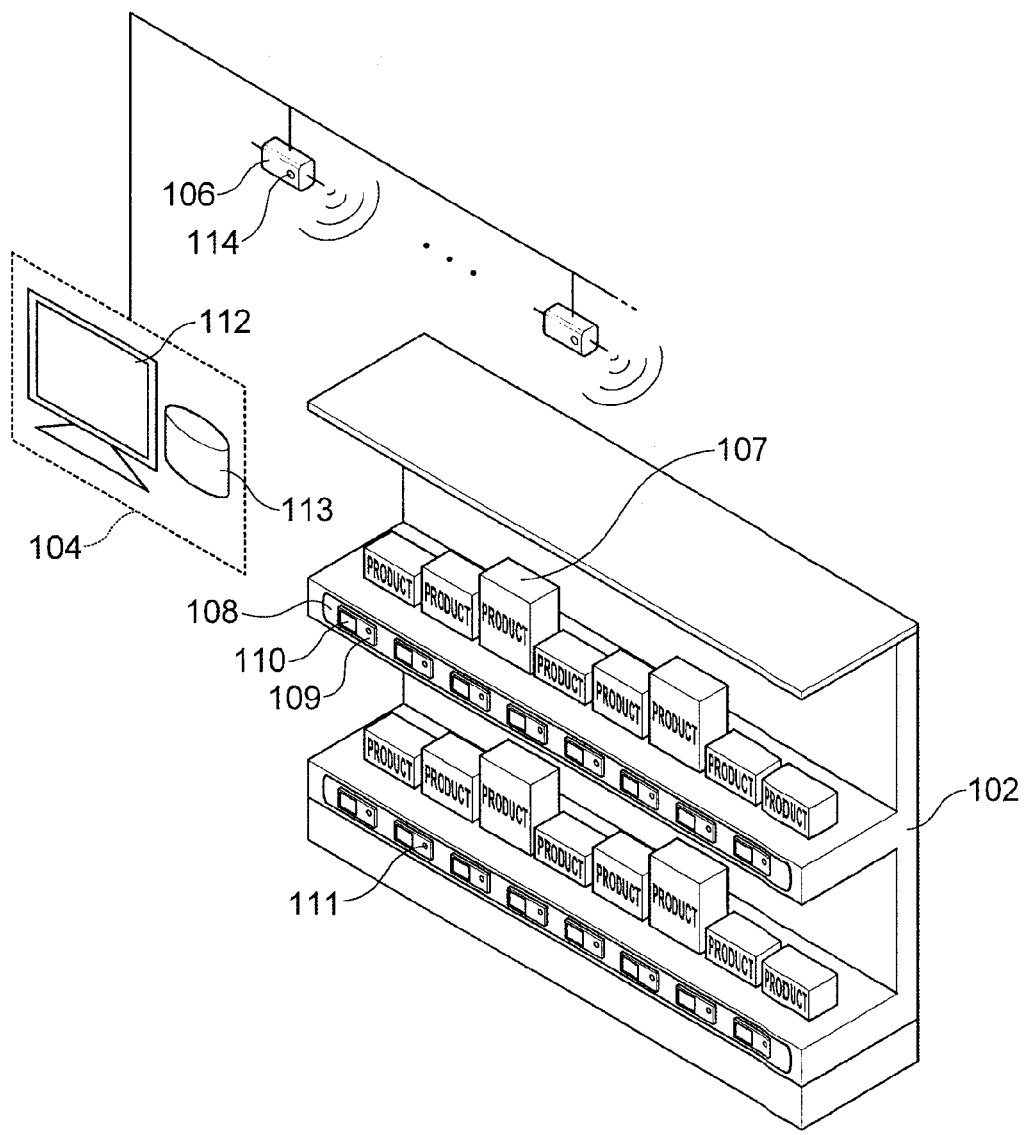
FIG. 1 is a block diagram showing a configuration of an electronic shelf label system according to an exemplary embodiment of the present invention.

FIG. 1 is a block diagram showing a configuration of an electronic shelf label system 100 according to an exemplary embodiment of the present invention.

An electronic shelf label system 100 according to an exemplary embodiment of the present invention includes a product display stand 102, a server 104, and a wired/wireless communication converter 106, as shown in FIG. 1.

Functions of each block of the electronic shelf label system 100 constituted as described above will be described below.

First, each of the shelves of the product display stand 102 displays a plurality of products 107, wherein the fronts of each shelf are installed with rails 108. The rails 108 are used for installing electronic tags 109 to display product information. The electronic tag 109 provides basic information, such as prices of products, a period of circulation, production dates, or the like, through a display panel 110. Meanwhile, each of the electronic tags 109 includes battery warning lights 111. When the residual amount of a battery embedded therein is a reference value or less, the electronic tags 109 turns-on the battery warning light 111 and transmits replacement request signals to the server 104 through the wired/wireless communication converter 106. Therefore, a field engineer can intuitively identify a request for replacing the battery of the electronic tag 109 according to the turn-on and off state of a battery warning light 111, by immediately replacing the battery on the spot and a server manager identifies a request for replacing the battery of the electronic tag 109 according to the replacement request signals transmitted to the server 104.

Meanwhile, the server 104 includes an information processor 112 for receiving or processing the product information and a database unit 113 for storing the product information. The server 104 receives the battery replacement request signals of the electronic tags 109 and displays request contents on a screen to inform the server manager or transmit them to portable electronic devices carried by the field engineer to directly inform the field engineer. In this case, the information processor 112 may be a computer.

The wired/wireless communication converter 106 receives the product information from the server 104 and wirelessly transmits it to the electronic tags 109 of the product display stand 102. To the contrary, the wired/wireless communication converter 106 receives the product information or the battery replacement request signals transmitted from the electronic tags 109 and transmits them to the server 104. As described above, the wired/wireless communication converter 106 relays the information transmission between the server and the electronic tags 109. Several wired/wireless communication converters 106 may be installed according to the size of a store and each of them serves to relay a predetermined number of electronic tags 109. Meanwhile, the wired/wireless communication converter 106 also includes the battery warning light 114 and when the wired/wireless communication converter 106 generates the replacement request signals of at least one of the electronic tags 109 to be relayed thereby, it turns-on the battery warning light 114 to inform the battery replacement request to the outside.

Whether the battery of the electronic tag 109 should be replaced can be identified by only the turn-on and off state of a battery warning light 111 installed in the electronic tag 109, but when the battery warning light 114 is also installed in the wired/wireless communication converter 106, it can further reduce the checking time by the field engineer. In other words, when the battery warning light 114 of the wired/wireless communication converter 106 installed on a ceiling or a wall is turned-on, the field engineer confirms only the electronic tags 109 relayed by the wired/wireless communication converter 106 of which the battery warning light 114 is turned-on, thereby making it possible to remarkably reduce the number of targets to check and the total checking time.

Figure 2:
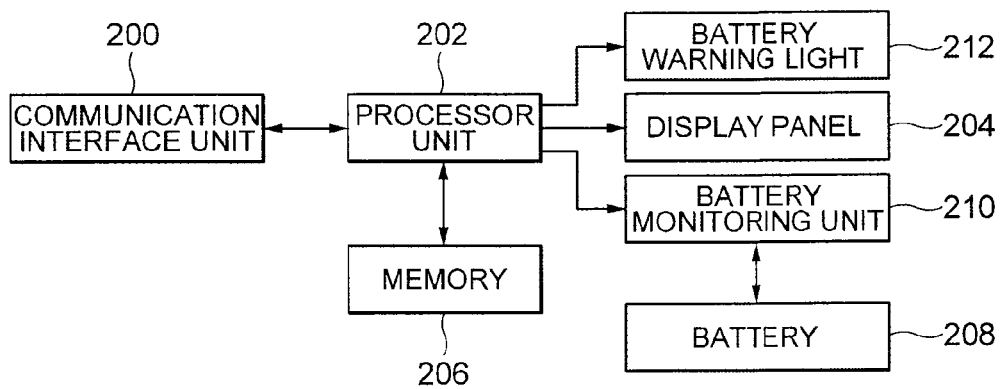
FIG. 2 is a block diagram showing components in the electronic tag of FIG. 1.

FIG. 2 is a block diagram showing components in the electronic tag of FIG. 1.

The electronic tag 109 includes a communication interface unit 200, a processor unit 202, a display panel 204, a memory 206, a battery 208, a battery monitoring unit 210, and a battery warning light 212, as shown in FIG. 2.

First, the communication interface unit 200 performs wireless communication with the wired/wireless converter to transmit and receive the product information or transmit the replacement request signals for the battery. The processor unit 202 processes the received product information and transmits it to the display panel 204. The display panel 204 visually implements the transmitted product information. The memory 206 serves to store the received product information through the communication interface unit 200.

Figure 3:
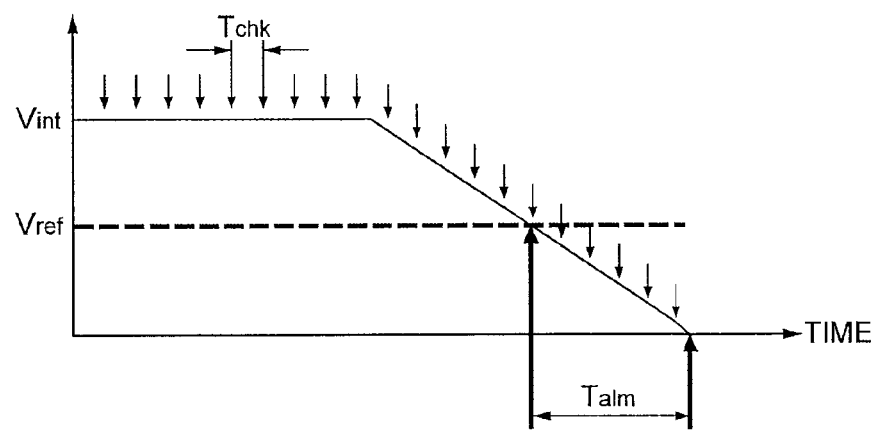
FIG. 3 is a waveform showing a relationship between voltage and time of battery for explaining an operation of a battery monitoring unit of FIG. 2.

Meanwhile, the electronic tag 109 includes a battery 208 for supplying power and a battery monitoring unit 210 monitoring the residual amount of a battery. Referring to FIG. 3, the battery monitoring unit 210 monitors the residual amount of a battery 208, of which the voltage level is gradually lowered from an initial rated voltage Vint as time elapses, at a predetermined checking period Tchk. Although not shown in the Figures, the battery monitoring unit 210 includes a comparing circuit that measures the battery voltage at each checking period Tchk and compares the battery voltage with the reference voltage Vref to output signals according to the comparison results. The processor unit 202 turns-on the battery warning light 212 during a replacement warning period Talm until the battery is completed discharged after the battery voltage reaches a reference voltage Vref level to request the replacement of a battery to the field engineer in the store. Separately, the processor unit 202 transmits the replacement request signals for the battery to the wired/wireless communication converter through the communication interface unit 200. In this case, even after the battery voltage reaches the reference voltage Vref, the battery monitoring unit 210 may continuously monitor the residual amount of a battery by the control of the processor unit 202. Alternatively, the battery monitoring unit 210 stops monitoring the residual amount of a battery and determines the remaining lifespan of a battery in consideration of the reduction rate of a battery voltage level, thereby making it possible to set the replacement warning period Talm. The processor unit 202 periodically transmits the replacement request signals to the server through the wired/wireless communication converter during the replacement warning period Talm but stops transmitting the replacement request signals when the battery is replaced in the middle.

As described above, the electronic tag 109 informs only whether the battery should be replaced to the outside by the battery warning light 212. In order to more accurately represent the state of the residual amount of a battery, a method of inserting a design in a battery shape into the display panel 204 and representing a state of a power supply with the number of bars in the battery may also be used. However, this is inefficient since considerable efforts and time are needed to confirm the display panels 204 installed in several thousands to tens of thousands of electronic tags 109 installed in the distribution store one by one. Therefore, the battery warning light 212 emitting light with specific colors like LED is installed in the electronic tag 109 to display whether the battery should be replaced according to the turn-on and off of the light. Therefore, the field engineer can intuitively and rapidly search the electronic tag 109 of which the battery should be replaced among a large number of electronic tags 109. In addition to the LED, various types of light emitting devices may be used as the battery warning light 212. The battery warning light may be installed at any position on the electronic tag 109 as long as it can secure visibility only.

As described above, the electronic tag 109 informs the field engineer of the fact that the battery 208 embedded in the electronic tag 109 reaches the replacement time through the battery warning light 212 and also transmits the replacement request signals to the server to allow the server manager to identify the fact.

Figure 4:
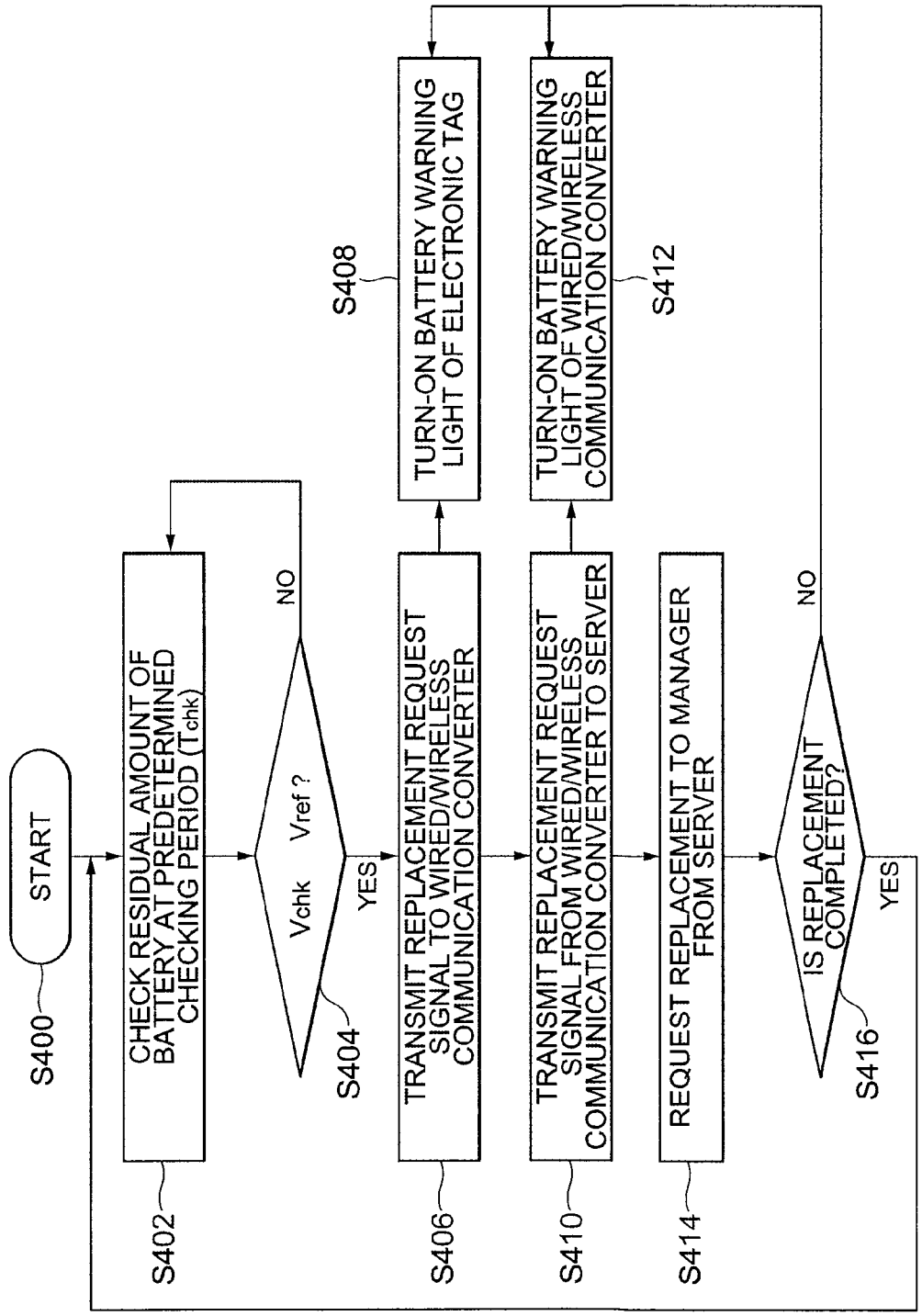
FIG. 4 is a flowchart for explaining a method of warning whether a battery of an electronic shelf label system according to the present invention should be replaced.

FIG. 4 is a flowchart for explaining a method of warning whether a battery of an electronic shelf label system according to the present invention should be replaced.

First, the electronic tag checks the residual amount of a battery at each checking period Tchk (S402). In this case, the residual amount of a battery is continuously checked by returning to the previous step S402, if it is determined that a measurement voltage Vchk is larger than the reference voltage Vref by comparing the measurement voltage Vchk of a battery with the reference voltage Vref thereof (S404). On the other hand, if it is determined that the measurement voltage Vchk is smaller than the reference voltage Vref, the electronic tag transmits the replacement request signals to the wired/wireless communication converter for replacing the battery (S406) and turns-on the battery warning light installed in the electronic tag (S408).

Next, the wired/wireless communication converter receiving the replacement request signals of the electronic tag transmits the replacement request signals to the server (S410) and turns-on the battery warning light installed in the wired/wireless communication converter (S412).

The server requests the battery replacement to the manager in response to the replacement request signals (S414). In this case, the server receives the replacement request signals and displays them on the computer screen to inform the server manager and transmits the replacement requesting information to the portable electronic devices carried by the field engineer in the store to inform the field manager. Thereafter, it confirms whether the battery of the corresponding electronic tag is replaced (S416). In this case, if it is determined that the battery replacement of the corresponding electronic tag is completed, it is again returned to an initial step (S402) to check the residual amount of a battery at a predetermined checking period Tchk and when the battery replacement is not yet completed, the battery warning light of the electronic tag and the wired/wireless communication converter continuously maintains the turn-on state (S408 and S412).

The exemplary embodiment of the present invention can intuitively and easily confirm when the battery of the electronic tag needs to be replaced, thereby making it possible to improve the efficiency in the working of replacing the battery.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

Accordingly, the scope of the present invention is not construed as being limited to the described embodiments but is defined by the appended claims as well as equivalents thereto.

What is claimed is:

1. An electronic shelf label system, comprising:
a plurality of electronic tags to be installed on a product display stand and each configured to
receive power from a battery,
check a residual amount of the battery, and
when the residual amount is smaller than a reference voltage, turn on a first battery warning light and transmit a replacement request signal to inform a replacement time of the battery, wherein each of the electronic tags is configured to periodically check the residual amount of the corresponding battery at each of a plurality of predetermined checking periods; and
a wired/wireless communication converter configured to
relay information between the electronic tags and a server, and
transmit the replacement request signal received from any of the electronic tags to the server, wherein
each of the electronic tags includes
the battery embedded in the electronic tag,
a battery monitoring unit configured to compare a battery voltage of the battery with the reference voltage at said each predetermined checking period, and
a processor unit configured to turn on the first battery warning light and transmit the replacement request signal to the wired/wireless communication converter, when the battery voltage is lower than the reference voltage according to a comparison result from the battery monitoring unit, and
the processor unit is configured to periodically transmit the replacement request signal to the wired/wireless communication converter during a replacement warning period after the battery voltage drops down to or below the reference voltage.

2. The electronic shelf label system according to claim 1, wherein the wired/wireless communication converter is further configured to turn on a second battery warning light in response to the replacement request signal.

3. The electronic shelf label system according to claim 2, wherein the wired/wireless communication converter is configured to turn on the second battery warning light when at least one of the electronic tags transmits the replacement request signal.

4. The electronic shelf label system according to claim 1, wherein the battery monitoring unit includes a comparing circuit configured to
measure the battery voltage at said each predetermined checking period,
compare the battery voltage with the reference voltage, and
transmit the comparison result to the processor unit.

5. The electronic shelf label system according to claim 1, wherein the processor unit is further configured to set the replacement warning period to a period in which the battery is discharged after the battery voltage drops down to or below the reference voltage.

6. The electronic shelf label system according to claim 1, wherein the processor unit is further configured to stop transmitting the replacement request signal when the battery is replaced during the replacement warning period.

7. The electronic shelf label system according to claim 1, wherein the processor unit is further configured to
stop the battery monitoring unit from checking the residual amount of the battery after the battery voltage drops down to or below the reference voltage, and
determine the residual amount of the battery in consideration of a reduction rate of the battery voltage to set the replacement warning period.

8. A method of operating an electronic shelf label system including a plurality of electronic tags each including a battery, a battery monitoring unit for monitoring a residual amount of the battery, and a wired/wireless communication converter for relaying information between the electronic tags and a server, the method comprising:
at each of the electronic tags,
periodically checking a battery voltage of the battery at each of a plurality of predetermined checking periods;
turning-on a first battery warning light on the electronic tag and transmitting a replacement request signal to the wired/wireless communication converter to request a replacement of the battery, when the battery voltage is lower than a reference voltage; and at the wired/wireless communication converter,
transmitting the replacement request signal to the server, wherein each of the electronic tags includes
the battery embedded in the electronic tag,
a battery monitoring unit configured to compare a battery voltage of the battery with the reference voltage at said each predetermined checking period, and
a processor unit configured to turn on the first battery warning light and transmit the replacement request signal to the wired/wireless communication converter, when the battery voltage is lower than the reference voltage according to a comparison result from the battery monitoring unit, and the transmitting a replacement request signal to the wired/wireless communication converter includes periodically transmitting the replacement request signal to the wired/wireless communication converter during a replacement warning period after the battery voltage drops down to or below the reference voltage.

9. The method according to claim 8, further comprising:
turning on a second battery warning light on the wired/wireless communication converter in response to the replacement request signal.

10. The method according to claim 9, wherein the wired/wireless communication converter turns-on the second battery warning light when at least one of the electronic tags transmits the replacement request signal.

11. The method according to claim 8, further comprising:
after the battery voltage drops lower than the reference voltage, maintaining a turn-on state of the first battery warning light until the battery is replaced or until the battery is depleted.

12. The method according to claim 11, further comprising:
after the battery voltage drops lower than the reference voltage, maintaining a turn-on state of the second battery warning light until the battery is replaced.

* * * * *